United States Patent
Choi et al.

(10) Patent No.: US 11,435,397 B2
(45) Date of Patent: Sep. 6, 2022

(54) WAFER LEVEL METHODS OF TESTING SEMICONDUCTOR DEVICES USING INTERNALLY-GENERATED TEST ENABLE SIGNALS

(71) Applicant: Samsung Electronics Co., Ltd., Suwon-si (KR)

(72) Inventors: Ahn Choi, Seoul (KR); Reum Oh, Hwaseong-si (KR)

(73) Assignee: Samsung Electronics Co., Ltd.

( * ) Notice: Subject to any disclaimer, the term of this patent is extended or adjusted under 35 U.S.C. 154(b) by 361 days.

(21) Appl. No.: 16/665,318

(22) Filed: Oct. 28, 2019

(65) Prior Publication Data
US 2020/0371157 A1 Nov. 26, 2020

(30) Foreign Application Priority Data
May 20, 2019 (KR) .................. 10-2019-0059130

(51) Int. Cl.
*G01R 31/28* (2006.01)
*G01R 31/3185* (2006.01)
*G01R 31/317* (2006.01)

(52) U.S. Cl.
CPC ... *G01R 31/2884* (2013.01); *G01R 31/31715* (2013.01); *G01R 31/318511* (2013.01)

(58) Field of Classification Search
CPC ............... G11C 29/1201; G11C 29/48; G01R 31/318511; G01R 31/2853
See application file for complete search history.

(56) References Cited

U.S. PATENT DOCUMENTS

| | | | |
|---|---|---|---|
| 6,094,056 A | 7/2000 | Bardsley et al. | |
| 6,914,259 B2 | 7/2005 | Sakiyama et al. | |
| 7,707,467 B2 | 4/2010 | Louie et al. | |
| 7,716,550 B2 | 5/2010 | Noh | |
| 9,406,401 B2 | 8/2016 | Lo et al. | |
| 9,851,401 B2 | 12/2017 | Kim et al. | |
| 9,959,184 B2 | 5/2018 | Park et al. | |
| 2010/0109701 A1* | 5/2010 | Yun .................... | G11C 29/1201 326/16 |
| 2010/0237891 A1* | 9/2010 | Lin ..................... | G01R 31/2851 324/750.3 |
| 2012/0173924 A1* | 7/2012 | Xiao ................... | G06F 11/1068 714/15 |

(Continued)

FOREIGN PATENT DOCUMENTS

| | | |
|---|---|---|
| KR | 10-0206700 | 4/1999 |
| KR | 10-1999-0039586 | 6/1999 |
| KR | 10-2016-0146404 | 12/2016 |

*Primary Examiner* — Jermele M Hollington
*Assistant Examiner* — Temilade S Rhodes-Vivour
(74) *Attorney, Agent, or Firm* — Myers Bigel, P.A.

(57) ABSTRACT

A wafer-level method of testing an integrated circuit (IC) device includes: (i) applying a plurality of test operation signals to a wafer containing the IC device, (ii) generating a test enable signal in response to detecting, on the wafer, a toggling of at least one of the plurality of test operation signals, and then (iii) testing at least a portion of the IC device in response to the generating the test enable signal. The generating may also include generating a test enable signal in response to detecting, on the wafer, an inactive-to-active transition of a toggle detection signal.

20 Claims, 16 Drawing Sheets

(56) References Cited

U.S. PATENT DOCUMENTS

| | | | |
|---|---|---|---|
| 2012/0307867 A1* | 12/2012 | Chung | G01R 19/0084 |
| | | | 374/170 |
| 2014/0185393 A1* | 7/2014 | Ong | G11C 29/50012 |
| | | | 365/189.011 |
| 2017/0365356 A1 | 12/2017 | Shibata et al. | |
| 2019/0164624 A1* | 5/2019 | Jung | G11C 29/44 |

* cited by examiner

WAFER LEVEL METHODS OF TESTING SEMICONDUCTOR DEVICES USING INTERNALLY-GENERATED TEST ENABLE SIGNALS

REFERENCE TO PRIORITY APPLICATION

This application claims the benefit of Korean Patent Application No. 10-2019-0059130, filed May 20, 2019, the disclosure of which is hereby incorporated herein by reference.

BACKGROUND

The inventive concept relates to integrated circuit devices and, more particularly, to wafer level methods of testing integrated circuit devices.

In general, a semiconductor device formed on a silicon substrate is fabricated through a series of discrete processes including, but not limited to, a lamination process of films, a doping process of impurities, a photolithography process of patterning these films, and an etching process. A test is typically performed to determine whether semiconductor devices fabricated on a wafer through a fabrication (FAB) process correctly operate to meet a particular design.

During a wafer level test of a semiconductor device, a tester having an array of probes may cause a test pad failure as a test pad(s) physically and electrically contacts a probe pin while a test is performed by applying a test enable signal through the test pad(s). The test pad failure may lead to a semiconductor device being stuck in a test mode during an expected normal mode of operation.

SUMMARY

The inventive concept provides a wafer level test method of a semiconductor device, by using an internal test enable signal generated inside a die of the semiconductor device, and without receiving a test enable signal from a tester through a test pad.

According to an aspect of the inventive concept, there is provided a wafer level test method of a semiconductor device included in a die formed on a top surface of a wafer. In some embodiments of the inventive concept, this wafer level test method includes: (i) receiving, on the die, test operation signals provided by an external tester via test pads of the die, (ii) detecting, on the die, a toggling of any one of the test operation signals, (iii) generating, on the die, an internal test enable signal in response to the detected toggling, and (iv) performing, on the die, a test on the semiconductor device based on the internal test enable signal.

According to another aspect of the inventive concept, there is provided a wafer level test method of a stacked semiconductor chip in which a plurality of core dies including semiconductor devices configured to independently operate and a buffer die configured to provide a channel interface (independent of each of the core dies) are stacked. This wafer level test method includes: (i) setting, on the buffer die, a mode register set (TMRS) bit signal allocated to indicate that an access signal pad is not used by an external tester, (ii) receiving, on the buffer die, master test operation signals provided by the external tester via master test pads of the buffer die, (iii) detecting, on the buffer die, a toggling of any one of the master test operation signals, and (iv) generating, on the buffer die, an internal master test enable signal in response to the detected toggling (after receiving the TMRS bit signal), (v) transmitting, on the buffer die, the internal master test enable signal via through-electrodes of the core dies to an internal test enable signal line of a channel selected from the core dies, and (vi) performing a test on the semiconductor device, in the selected channel, based on the internal master test enable signal.

According to another aspect of the inventive concept, there is provided a semiconductor device included in a die formed on a top surface of a wafer. This semiconductor device includes: (i) a test circuit configured to perform a test on the semiconductor device, and (ii) test pads connected to the test circuit. The test pads are configured to receive test operation signals provided for a probe test by an external tester. The test circuit is configured to detect a toggling of any one of the test operation signals, generate an internal test enable signal in response to the detected toggling, and perform the test on the semiconductor device based on the internal test enable signal.

According to another aspect of the inventive concept, there is provided a stacked semiconductor chip including: (i) a plurality of core dies including the semiconductor devices (each configured to independently operate), and (ii) a buffer die configured to provide a channel interface independent of each of the core dies via through-electrodes of the core dies. The buffer die includes: (i) master test pads configured to receive master test operation signals provided by an external tester for a probe test, (ii) a mode register configured to set a bit signal allocated to indicate that a test access signal pad among the master test pads is not used by the external tester, and (iii) a master test circuit. This master test circuit is configured to output a toggle detection signal, by detecting a toggling of any one of the master test operation signals, generate the internal master test enable signal in response to the bit signal of the mode register and the toggle detection signal, and transmit, via the through-electrodes, the internal master test enable signal to an internal test enable signal line of a channel selected from the core dies.

According to further aspects of the inventive concept, a wafer-level method of testing an integrated circuit (IC) device includes: (i) applying a plurality of test operation signals to a wafer containing the IC device, (ii) generating a test enable signal in response to detecting, on the wafer, a toggling of at least one of the plurality of test operation signals, and then (iii) testing at least a portion of the IC device in response to the generating the test enable signal. In these aspects, the wafer includes a plurality of IC dies therein, which are separated from each other by a plurality of scribe lines, and a first of the plurality of IC dies includes the IC device. The generating may also include generating a test enable signal in response to detecting, on the wafer, an inactive-to-active transition of a toggle detection signal. Alternatively, the generating may include generating a test enable signal in response to detecting, on the wafer, an: (i) inactive-to-active transition of a toggle detection signal, and (ii) an active level of a power supply stabilization signal during the inactive-to-active transition of the toggle detection signal. And, in other aspects, the generating may include generating a test detection signal in response detecting, on the wafer, a toggling of a first one of the plurality of test operation signals multiple times. Similarly, in other aspects, the generating may include generating a test detection signal in response detecting, on the wafer, a: (i) toggling of a first one of the plurality of test operation signals multiple times, and (ii) an inactive level of a reset signal during the toggling of the first one of the plurality of test operation signals multiple times.

According to still further aspects of the inventive concept, an integrated circuit wafer is provided, which includes a plurality of integrated circuit (IC) dies that are separated from each other by a plurality scribe lines on the wafer. The plurality of IC dies include a first IC die having a plurality of test pads thereon and a plurality of integrated circuits therein. The plurality of integrated circuits includes a test circuit, which is configured to generate a test enable signal in response to detecting a toggling of at least one of a plurality of test operation signals applied to the plurality of test pads by an external tester electrically coupled by a plurality of probes to the plurality of test pads. This test circuit may also be configured to generate the test enable signal in response to detecting an inactive-to-active transition of a toggle detection signal within the test circuit. In addition, the test circuit may be configured to generate the inactive-to-active transition of the toggle detection signal in response to detecting a toggling of a first one of the plurality of test operation signals multiple times.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
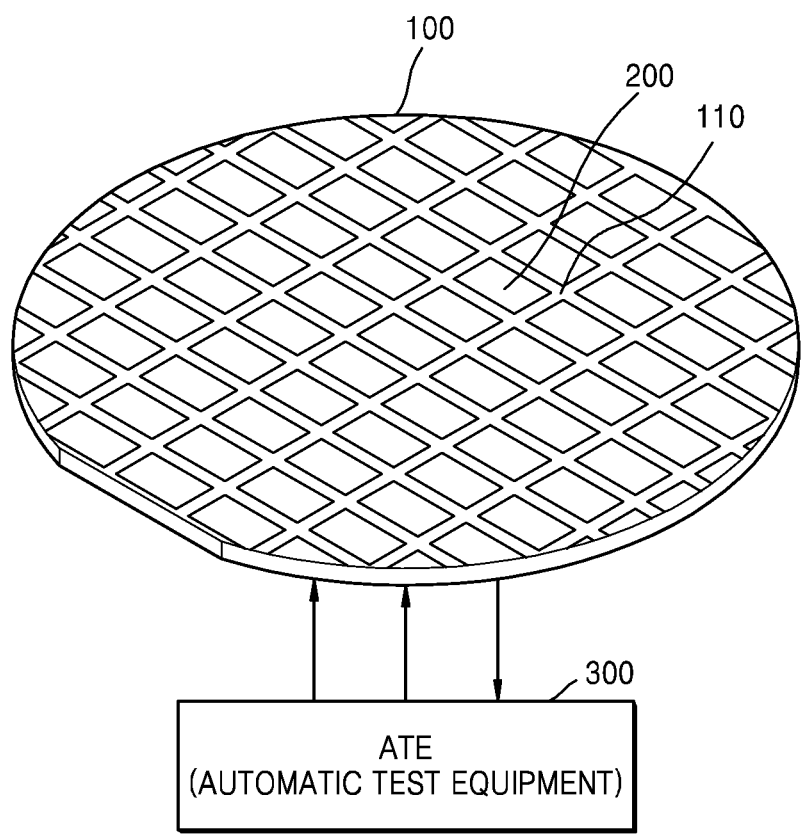
FIG. 1 is a schematic diagram of a wafer on which a plurality of semiconductor devices are formed.
Figure 2:
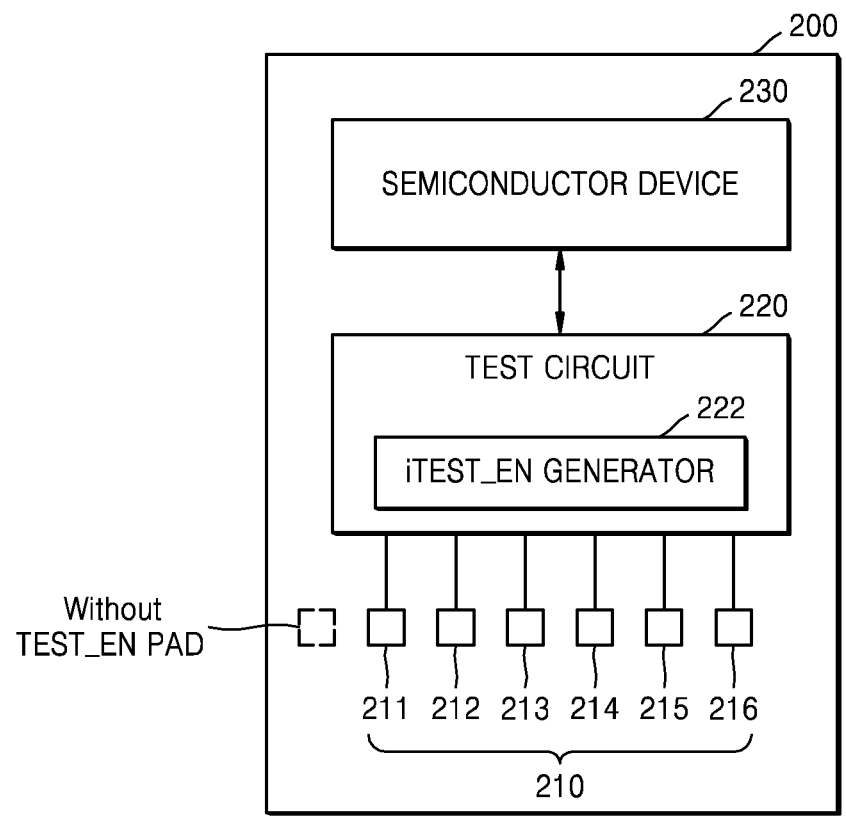
FIG. 2 is an enlarged diagram of a die of a semiconductor device, according to embodiments of the inventive concept.

FIG. 1 is a schematic diagram of a wafer on which a plurality of semiconductor devices are formed, and FIG. 2 is an enlarged diagram of a die in a semiconductor device, according to embodiments of the inventive concept. Referring to FIGS. 1 and 2, a plurality of dies 200 may be formed on a wafer 100 through a fabrication (FAB) process, and after the plurality of dies 200 are singulated along a scribe line 110, the plurality of dies 200 may be fabricated into individual unit chips or packages through an assembly process.

Between the FAB process and the assembly process, a wafer level test process or an electric die sorting (EDS) process in which electrical characteristics of a semiconductor device (230 in FIG. 2) formed in each of the plurality of dies 200 are tested may be performed. The wafer level testing process may be a process in which test operation signals are applied to a die 200 formed on the wafer 100 and whether the die 200 has a defect is determined by a test result signal output by the die 200 in response to the test operation signals. A tester 300 may provide the test operation signals, transfer the test operation signals to the die 200 via a probe card, and may determine whether the die 200 is defective by receiving the test result signal in response to the test operation signals from the die 200 via the probe card.

Each of the dies 200 may include test pads (210 in FIG. 2) thereon, which support the wafer level test. When the probe card physically and electrically contacts the test pads 210, the die 200 may perform the test mode in response to the test operation signals. In this case, an electrostatic discharge (ESD) or noise may be induced via the test pads 210. The ESD may accompany potentially destructive effects of large voltage transients. An ESD protection circuit may be connected to each of the test pads 210 in preparation for the ESD.

The tester 300 may provide a test enable signal among the test operation signals to a test enable signal pad among the test pads 210. The test enable signal may act as a test command signal indicating the test mode, and when being activated to a logic high level, may be set to have a relatively high voltage level. However, when the large voltage transients of the test enable signal are applied to the test enable signal pad from the tester 300, the ESD protection circuit connected to the test enable signal pad may be shorted to a supply voltage level. Then, the test enable signal pad may be fixed to the supply voltage level.

Furthermore, after the wafer level test is completed, when each of the dies 200 individually is singulated by performing a sawing process on the wafer 100 along the scribe line 110 and is implemented as a stacked semiconductor chip by performing a packing process of laminating the dies 200 of good quality, the semiconductor device in the stacked semiconductor chip may operate only in the test mode but may not operate in a normal mode of write/read operations, due to the test enable signal pad being stuck to the supply voltage level.

Hereinafter, examples of the wafer level test method of the semiconductor device 230 by using an internal test enable signal generated in the die 200 of the semiconductor device 230 without receiving the test enable signal from the tester 300 via the test pad 210 are described in detail.

Referring to FIG. 2, the die 200 may include at least one or more test pads 210, a test circuit 220, and the semiconductor device 230. For convenience of explanation, the die 200 in FIG. 2 illustrates that the test pads 210 and the test circuit 220 are separated from the semiconductor device 230. However, the die 200 may be substantially regarded as a semiconductor device 230, and the test pads 210 and the test circuit 220 may be understood as being included in the semiconductor device 230.

The test pads 210 may not include a test enable signal pad for receiving a test enable signal TEST_EN provided by the tester (300 in FIG. 1). The test pads 210 may receive test operation signals (except for the test enable signal TEST_EN) from the tester 300. The test operation signals may include a test clock signal, a test command signal, a test pattern signal, etc. for controlling operations of the semiconductor device 230. The test pads 210 may be connected to the test circuit 220, and the test circuit 220 may be connected to the semiconductor device 230.

According to an embodiment of the inventive concept, the test pads 210 may include test enable signal pads TEST_EN PAD. In this case, the tester 300 may be configured not to use the test enable signal pads TEST_EN PAD. The semiconductor device 230 may include a volatile memory device or a non-volatile memory device. The volatile memory device may include dynamic random access memory (RAM) (DRAM), synchronous DRAM (SDRAM), double data rate (DDR) SDRAM, low power double data rate (LPDDR) SDRAM, graphics double data rate (GDDR) SDRAM, rambus DRAM (RDRAM), etc. The non-volatile memory device may include a flash memory device including flash memory cells or a memory device such as resistance RAM (ReRAM), magnetic RAM (MRAM), and phase-change RAM (PRAM) including resistive memory cells.

In addition, the semiconductor device 230 may include a processor or a power management integrated circuit (PMIC). The processor may include a microprocessor (or micro control unit) or a central processing unit (CPU) that executes various computing functions such as particular computations and tasks. The processor may include a single core processor or a plurality of multi-core processors such as dual-core, quad-core, and hexa-core processors. The processor may further include a cache memory. The PMIC may be configured to reduce power consumption of mobile devices such as a smartphone and a tablet personal computer (PC) and to increase power efficiency.

As described herein, the die 200 may be coupled to the tester 300 including probes via test pads 210 for performing the wafer level test. In the wafer level test, the test circuit 220 may provide a test clock signal, a test command signal, a test address signal, and/or a test pattern signal received via the test pads 210 to the semiconductor device 230. For simplicity of a drawing, the test circuit 220 and the semiconductor device 230 are illustrated as being connected to each other via one signal line, but may be actually connected to each other via a plurality of signal lines.

The test circuit 220 may be configured to detect a toggling of any one of the test operation signals applied to the test pads 210, and in response to the detected toggling, may include an internal test enable signal (iTEST_EN) generator 222 generating the iTEST_EN. According to the embodiment, the iTEST_EN generator 222 may be configured to detect a certain number, such as "n" (where n is an natural integer), of togglings of a second test operation signal in an interval in which a first test operation signal among the test operation signals is at a certain logic level, and in response to the "n" togglings of the second test operation signal, may generate the internal test enable signal iTEST_EN, as explained hereinbelow.

Figure 3:
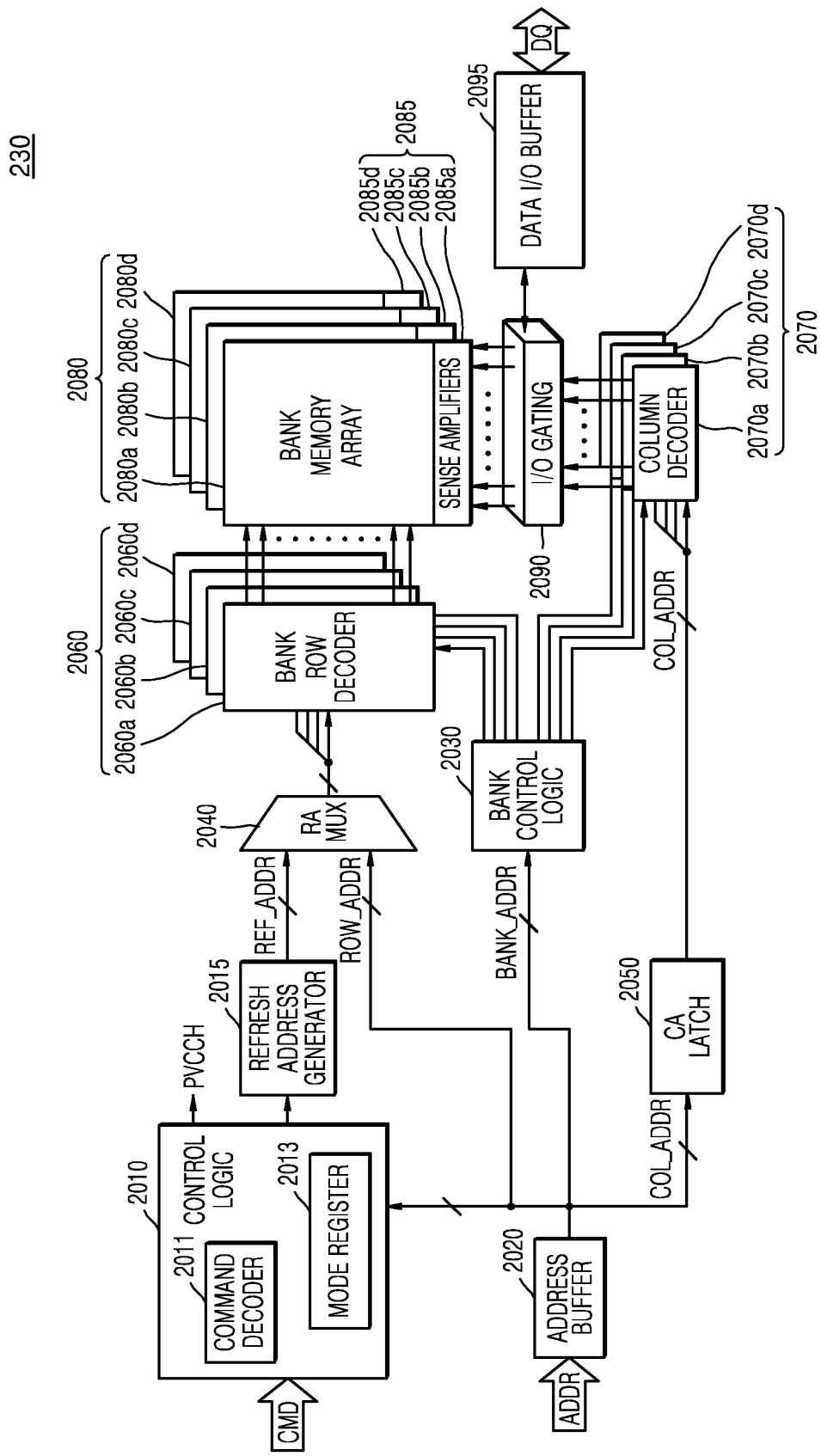
FIG. 3 is a block diagram of a configuration of a semiconductor device on a die in FIG. 2, according to embodiments of the inventive concept.

FIG. 3 is a block diagram of a configuration of the semiconductor device 230 on the die 200 in FIG. 2, according to embodiments of the inventive concept. In the present embodiment, the case in which the semiconductor device 230 is implemented as DRAM is described, however, other non-DRAM memory devices may be provided in other embodiments of the inventive concept.

Referring to FIG. 3, the semiconductor device 230 may include a control logic 2010, a refresh address generator 2015, an address buffer 2020, a bank control logic 2030, a row address (RA) multiplexer (MUX) 2040, a column address (CA) latch 2050, a row decoder 2060, a column decoder 2070, a memory cell array 2080, a sense amplifier 2085, an input/output (I/O) gating circuit 2090, and a data I/O buffer 2095.

The memory cell array 2080 may include first through fourth bank arrays (2080a, 2080b, 2080c, and 2080d). Each of the first through fourth bank arrays (2080a, 2080b, 2080c, and 2080d) may include a plurality of word lines, a plurality of bit lines, and a plurality of memory cells formed at intersections of the plurality of word lines and the plurality of bit lines.

The row decoder 2060 may include first through fourth bank row decoders 2060a, 2060b, 2060c, and 2060d connected to respective ones of the first through fourth bank arrays 2080a, 2080b, 2080c, and 2080d. The column decoder 2070 may include first through fourth bank column decoders 2070a, 2070b, 2070c, and 2070d connected to respective ones of the first through fourth bank arrays 2080a, 2080b, 2080c, and 2080d. And, the sense amplifier 2085 may include first through fourth bank sense amplifiers 2085a, 2085b, 2085c, and 2085d connected to respective ones of the first to fourth bank arrays 2080a, 2080b, 2080c, and 2080d.

The first through fourth bank arrays (2080a, 2080b, 2080c, and 2080d), the first through fourth bank row decoders (2060a, 2060b, 2060c, and 2060d), the first through fourth bank column decoders (2070a, 2070b, 2070c, and 2070d), and the first through fourth bank sense amplifiers (2085a, 2085b, 2085c, and 2085d) may constitute the first through fourth memory banks, respectively. In the illustrated embodiment, an example of the semiconductor device 230, including four memory banks, is illustrated, but according to other embodiments, the semiconductor device 230 may include a different number of memory banks.

The control logic 2010 may control the operation of the semiconductor device 230. The control logic 2010 may generate a power supply voltage stabilization signal PVCCH when a level of the power supply voltage for driving the semiconductor device 230 is stably maintained and control the semiconductor device 230 to be in an operable state by using the power supply voltage stabilization signal PVCCH. The control logic 2010 may generate control signals such that the semiconductor device 230 performs a write operation or a read operation. The control logic 2010 may include a command decoder 2011 for decoding a command CMD received from a memory controller and a mode register 2013 for setting an operation mode of the semiconductor device 230. The command decoder 2011 may generate control signals corresponding to the command CMD by decoding a write enable signal (/WE), a row address strobe signal (/RAS), a column address strobe signal (/CAS), a chip select signal (/CS), etc. The mode register 2013 may provide a plurality of operating options of the semiconductor device 230, and program various functions, characteristics, and modes of the semiconductor device 230.

The control logic 2010 may control the refresh address generator 2015 to perform an auto refresh operation in response to a refresh command, or control the refresh address generator 2015 to perform a self-refresh operation in response to a self-refresh entry command. The refresh address generator 2015 may generate a refresh address REF_ADDR corresponding to a memory cell row on which a refresh operation is to be performed. The refresh address generator 2015 may generate the refresh address REF_ADDR by a refresh cycle defined in the standard of the volatile memory device. However, when the semiconductor device 230 includes the above-described non-volatile memory device, the refresh address generator 2015 may be omitted.

The address buffer 2020 may receive an address ADDR including a bank address BANK_ADDR, a row address ROW_ADDR, and a column address COL_ADDR from the memory controller. In addition, the address buffer 2020 may provide the received bank address BANK_ADDR to the bank control logic 2030, the received row address ROW_ADDR to the RA MUX 2040, and the received column address COL_ADDR to the CA latch 2050.

The bank control logic 2030 may generate bank control signals in response to the bank address BANK_ADDR. In response to the bank control signals, one bank row decoder of the first through fourth bank row decoders (2060a, 2060b, 2060c, and 2060d) corresponding to the bank address BANK_ADDR may be activated, and one bank column decoder of the first through fourth bank column decoders (2070a, 2070b, 2070c, and 2070d) corresponding to the bank address BANK_ADDR may be activated.

The RA MUX 2040 may receive the row address ROW_ADDR from the address buffer 2020 and the refresh row address REF_ADDR from the refresh address generator 2015. The RA MUX 2040 may selectively output the row address ROW_ADDR or the refresh row address REF_ADDR. The row address ROW_ADDR output from the RA MUX 2040 may be applied to each of the first through fourth bank row decoders (2060a, 2060b, 2060c, and 2060d).

The bank row decoder activated by the bank control logic 2030 of the first through fourth bank row decoders (2060a, 2060b, 2060c, and 2060d) may decode the row address ROW_ADDR output from the RA MUX 2040 and activate the word line corresponding to the row address. For example, the activated bank row decoder may apply a word line drive voltage to the word line corresponding to the row address.

The CA latch 2050 may receive the column address COL_ADDR from the address buffer 2020 and temporarily store the received column address COL_ADDR therein. The CA latch 2050 may gradually increase the received column address COL_ADDR in a burst mode. The CA latch 2050 may apply the temporarily stored or gradually increased column address COL_ADDR to each of the first through fourth bank column decoders (2070a, 2070b, 2070c, and 2070d). The bank column decoder activated by the bank control logic 2030 of the first through fourth bank column decoders (2070a, 2070b, 2070c, and 2070d) may activate one sense amplifier corresponding to the bank address BANK_ADDR and the column address COL_ADDR.

The I/O gating circuit 2090, together with circuits for gating I/O data DQ, may include an input data mask logic, read data latches for storing read data output from the first through fourth bank arrays (2080a, 2080b, 2080c, and 2080d), and a write driver for writing data to the first through fourth bank arrays (2080a, 2080b, 2080c, and 2080d).

The read data output from one bank array of the first through fourth bank arrays (2080a, 2080b, 2080c, and 2080d) may be sensed by the sense amplifiers corresponding to the one bank array and may be stored in the read data latches. The write data to be written to the memory cell array of one bank array of the first through fourth bank arrays (2080a, 2080b, 2080c, and 2080d) may be provided to the data I/O buffer 2095 from the memory controller. Data provided to the data I/O buffer 2095 may be written to one bank array via the write driver.

The data I/O buffer 2095 may receive a test pattern signal provided by the tester (300 in FIG. 1) in the wafer level test as the I/O data DQ and may provide the test pattern signal to the I/O gating circuit 2090. The I/O gating circuit 2090 may write the test pattern signal to a target page of the memory cell array 2080 during the wafer level test, read the test pattern signal from the target page, and provide the test pattern signal to the data I/O buffer 2095 as the test result signal. The data I/O buffer 2095 may output the test result signal as the I/O data DQ.

Figure 4:
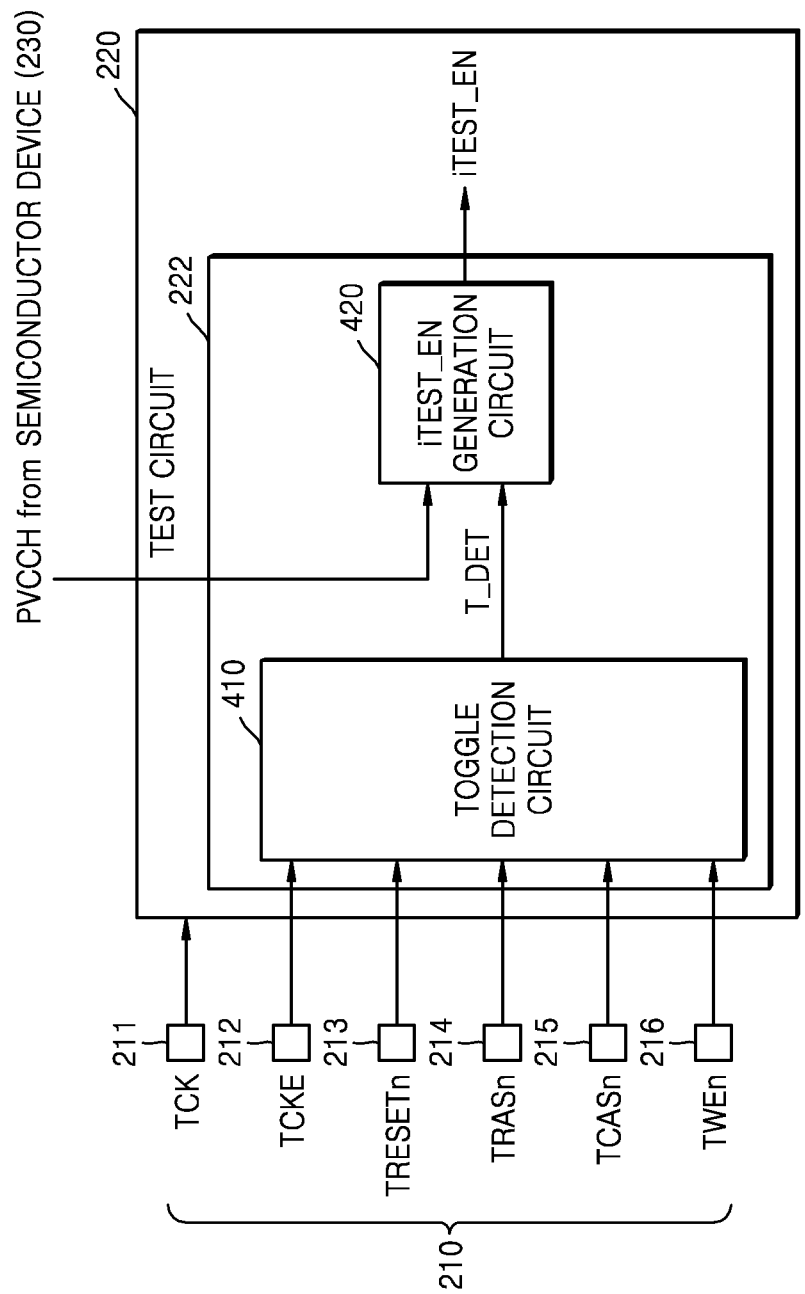
FIG. 4 is a block diagram of the test circuit in the die in FIG. 2, according to embodiments of the inventive concept.

FIG. 4 is a block diagram of the test circuit 220 in the die 200 in FIG. 2, according to embodiments of the inventive concept. Referring to FIG. 4, the test circuit 220 may include the iTEST_EN generator 222, which receives the test operation signals applied from the tester (300 in FIG. 1) via the test pads 210 and generates the iTEST_EN. The iTEST_EN generator 222 may include a toggle detecting circuit 410 and an iTEST_EN generation circuit 420.

The tester 300 may be configured such that a clock signal TCK is applied to a first test pad 211, a clock enable signal TCKE is applied to a second test pad 212, a reset signal TRESETn is applied to a third test pad 213, a row access strobe (RAS) signal TRASn is applied to a fourth test pad 214, a column access strobe (CAS) signal TCASn is applied to a fifth test pad 215, and a write enable signal TWEn is applied to a sixth test pad 216. The reset signal TRESETn, the RAS signal TRASn, the CAS signal TCASn, and the write enable signal TWEn of the third through sixth test pads 213 through 216, respectively, may be signals for controlling the operations of the semiconductor device 230. The reset signal TRESETn may include a signal that initializes the semiconductor device 230 to a reset for the correct operations of the semiconductor device 230.

The toggle detection circuit 410 may be connected to the second through sixth test pads 212 through 216, detect a toggling of any one of the signals applied to the second through sixth test pads 212 through 216, and output a toggle detection signal T_DET. The toggle detection circuit 410 may detect a toggling of any one of the clock enable signal TCKE, the reset signal TRESETn, the RAS signal TRASn, the CAS signal TCASn, and the write enable signal TWEn and may output the toggle detection signal T_DET as a detection result. As illustrated, the toggle detection signal T_DET may be triggered to the logic high level. The toggle detection signal T_DET may be provided to the iTEST_EN generation circuit 420.

The iTEST_EN generation circuit 420 may be configured to generate the internal test enable signal iTEST_EN in response to the toggle detection signal T_DET and the power supply voltage stabilization signal PVCCH. A power supply voltage stabilization signal PVCCH may be provided by the semiconductor device 230. The control logic (2010 in FIG. 3) of the semiconductor device 230 may generate the power supply voltage stabilization signal PVCCH when a level of the power supply voltage for driving the semiconductor device 230 is stably maintained constant. Illustratively, the power supply voltage stabilization signal PVCCH may be configured to be triggered to the logic high level.

The internal test enable signal iTEST_EN may be a signal indicating that the test circuit 220 is used for the wafer level test of the semiconductor device 230. The test circuit 220 may test electrical characteristics of the semiconductor device 230 on the wafer 100 based on the internal test enable signal iTEST_EN. The test circuit 220 may be configured to test items related to voltage I/O characteristics, current I/O characteristics, leakage characteristics, functional characteristics, operation characteristics, and/or timing characteristics of the semiconductor device 230, based on the internal test enable signal iTEST_EN.

Figure 5:
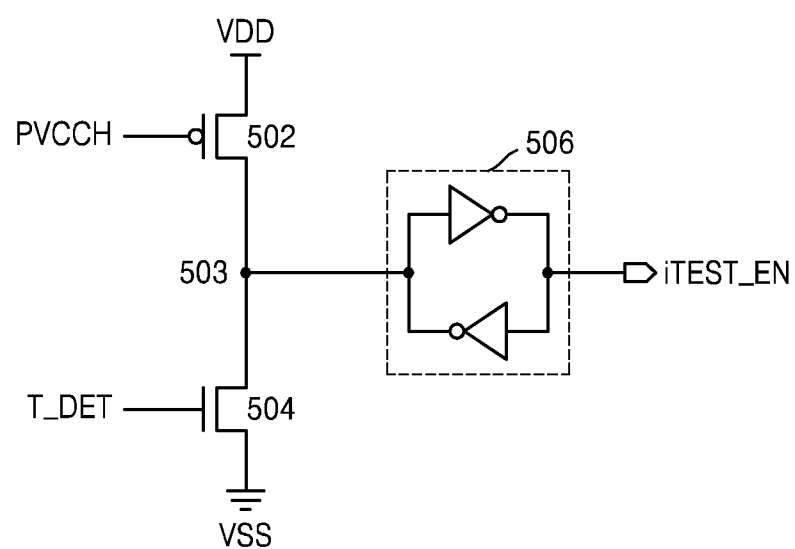
FIG. 5 is a detailed diagram of a configuration of an internal test enable signal generating circuit in FIG. 4.

FIG. 5 is a detailed diagram of a configuration of the iTEST_EN generation circuit 420 in FIG. 4. Referring to FIG. 5, the iTEST_EN generation circuit 420 may include a first transistor 502, a second transistor 504, and a latch 506. The first and second transistors 502 and 504 may be connected to each other in series between a power supply voltage VDD node and a ground voltage VSS node, and the first transistor 502 may be implemented as a p-channel metal-oxide-semiconductor (PMOS) transistor while the second transistor 504 may be implemented as an n-channel metal-oxide-semiconductor (NMOS) transistor. The power supply voltage stabilization signal PVCCH may be provided to a gate of the first transistor 502, and the toggle detection signal T_DET may be provided to a gate of the second transistor 504. The latch 506 may receive a voltage level of a connection node 503 of the first and second transistors 502 and 504 and output the internal test enable signal iTEST_EN as an output signal.

When the power supply voltage stabilization signal PVCCH is at a logic low level, the first transistor 502 may be turned on, the connection node 503 may have a level of the power supply voltage VDD, and the latch 506 may output the internal test enable signal iTEST_EN of the logic low level. When the internal test enable signal iTEST_EN is output at the logic low level, the test circuit 220 may be configured not to test the semiconductor device 230 in an inactive state.

When the power supply voltage stabilization signal PVCCH is at the logic high level, the first transistor 502 may be turned off. Thereafter, when the toggle detection signal T_DET is triggered to the logic high level, the second transistor 504 may be turned on, the connection node 503 may have the ground voltage VSS level, and the latch 506 may output the internal test enable signal iTEST_EN at the logic high level. When the internal test enable signal iTEST_EN is output at the logic low level, the test circuit 220 may be configured to test the semiconductor device 230 in an active state.

Figure 6A:
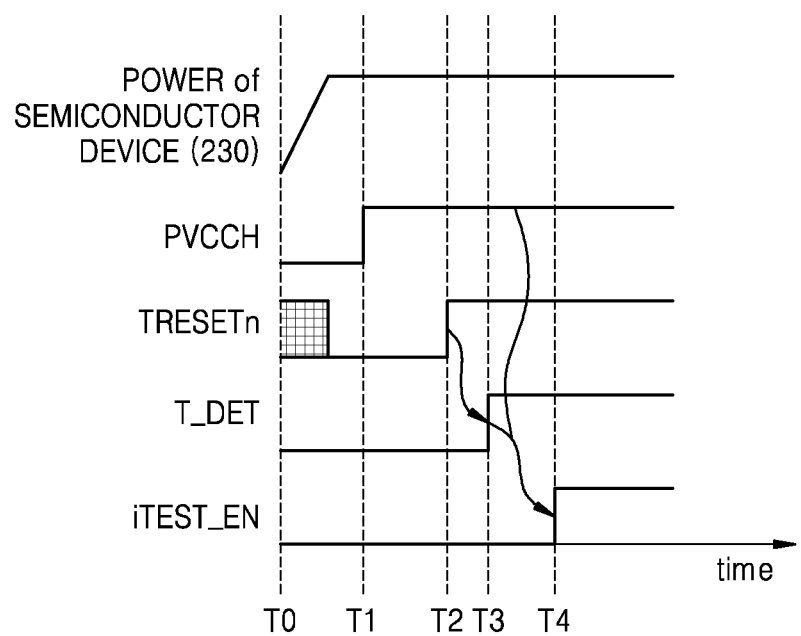
FIGS. 6A and 6B are timing diagrams illustrating the operation of the test circuit in FIG. 4.
Figure 6B:
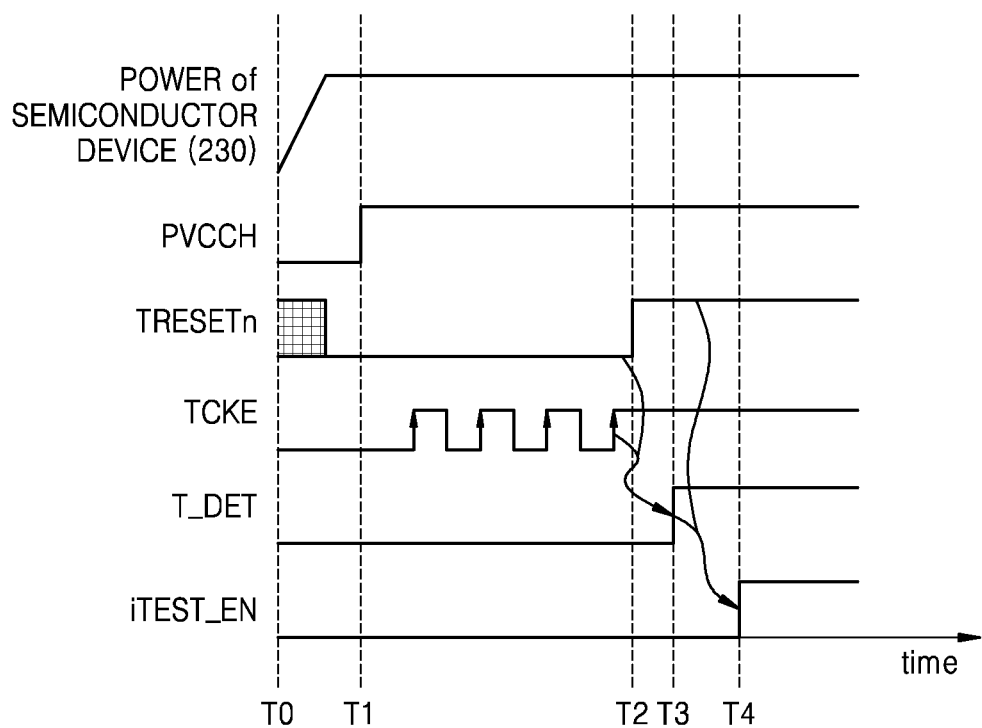

FIGS. 6A and 6B are timing diagrams illustrating the operation of the test circuit 220 in FIG. 4. FIG. 6A illustrates an operation in which the internal test enable signal iTEST_EN is output based on a toggling of the reset signal TRESETn to the logic high level among the test operation signals. FIG. 6B illustrates an operation in which the internal test enable signal iTEST_EN is output based on four togglings of the test clock enable signal TCKE in an interval in which the reset signal TRESETn is at the logic low level.

Referring to FIG. 6A in conjunction with FIGS. 1, 2, 4, and 5, at a time point T0, the test operation signals may be applied to the die 200 formed on the wafer 100 via the probe card from the tester 300. When the power supply voltage of the semiconductor device 230 is ramped up, the semiconductor device 230 may be initialized to a reset in response to a transition of the reset signal TRESETn to the logic low level.

At a time point T1, when the level of the power supply voltage for driving the semiconductor device 230 is stably maintained constant, the semiconductor device 230 may trigger the power supply voltage stabilization signal PVCCH to the logic high level. While the power supply voltage stabilization signal PVCCH is at the logic low level between the time point T0 and the time point T1, the iTEST_EN generation circuit 420 may deactivate the internal test enable signal iTEST_EN to the logic low level.

At a time point T2, the toggle detection circuit 410 may detect the toggling of the reset signal TRESETn among the test operation signals. According to the embodiment, the toggle detection circuit 410 may detect a toggling of any one of the clock enable signal TCKE, the RAS signal TRASn, the CAS signal TCASn, and the write enable signal TWEn, in place of the reset signal TRESETn.

At a time point T3, the toggle detection circuit 310 may trigger the toggle detection signal T_DET to the logic high level, as a result of the toggling detection of the reset signal TRESETn. And, at time point T4, the iTEST_EN generation circuit 420 may output the internal test enable signal iTEST_EN of the logic high level in response to both the power supply voltage stabilization signal PVCCH and the toggle detection signal T_DET of the logic high level. The internal test enable signal iTEST_EN of the logic high level may be configured such that the test circuit 220 performs the wafer level test for the semiconductor device 230. The semiconductor device 230 may be tested in response to the internal test enable signal iTEST_EN of the logic high level.

Referring to FIG. 6B relative to FIG. 6A, between the time point T1 and the time point T2, the toggle detection circuit 410 may detect a toggling of any one of the other test operation signals among the test operation signals of the test pads 210 while the reset signal TRESETn is at the logic low level. The toggle detection circuit 410 may detect a certain number of togglings of the clock enable signal TCKE during a period in which the reset signal TRESETn is at the logic low level.

Although the present embodiment illustrates an example of detecting the certain number of, that is, 4 togglings of the clock enable signal TCKE set to the logic high level, the number of togglings may be variously set to n (wherein n is a natural number). According to the embodiment, the toggle detection circuit 410 may, while the reset signal TRESETn is at the logic low level, the certain number of, that is, n, togglings of the RAS signal TRASn, detect the CAS signal TCASn, or the write enable signal TWEn, in place of the clock enable signal TCKE.

At the time point T3, the toggle detection circuit 410 may, during a period in which the reset signal TRESETn is at the logic low level, trigger the toggle detection signal T_DET to the logic high level, based on the number of, or 4, togglings of the clock enable signal TCKE set to the logic low level.

At the time point T4, the iTEST_EN generation circuit 420 may output the internal test enable signal iTEST_EN of the logic high level in response to both the power supply voltage stabilization signal PVCCH and the toggle detection signal T_DET of the logic high level. The semiconductor device 230 may be tested in response to the internal test enable signal iTEST_EN of the logic high level.

Figure 7A:
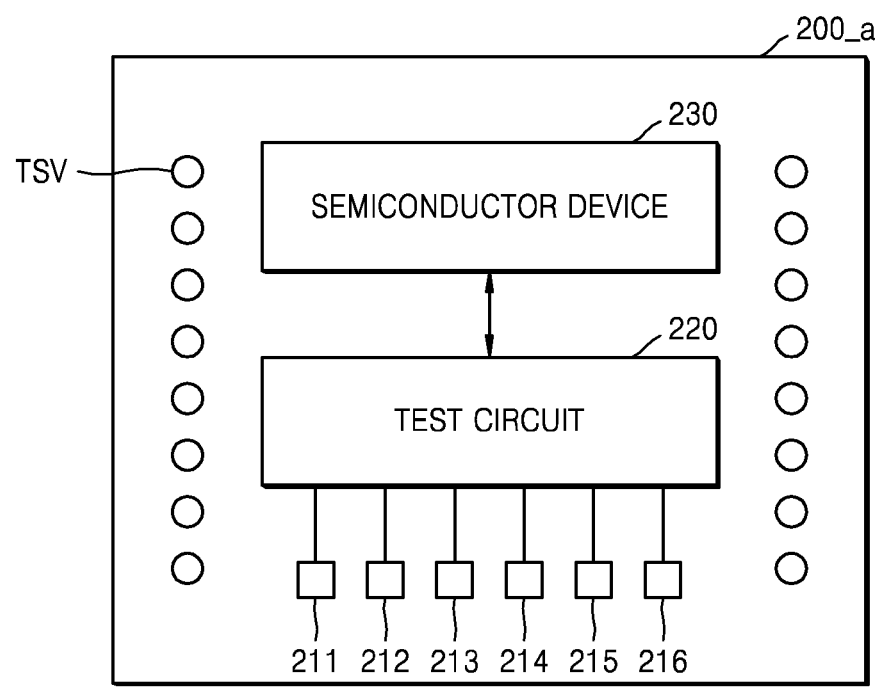
FIGS. 7A and 7B are enlarged diagrams of a die of a semiconductor device, according to embodiments of the inventive concept.
Figure 7B:
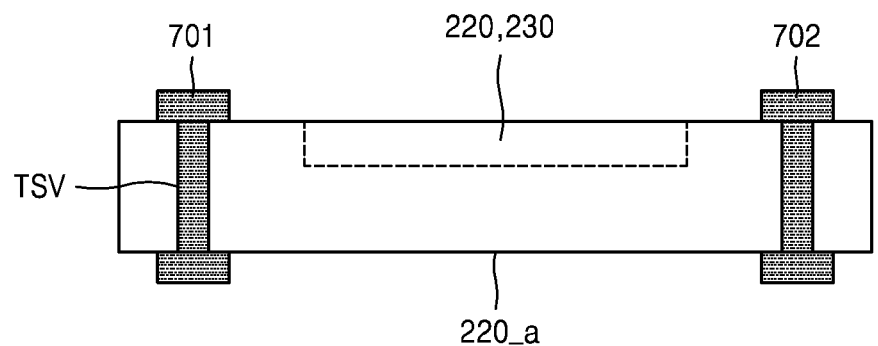

FIGS. 7A and 7B are enlarged diagrams of a die 200_a of the semiconductor device 230, according to embodiments of the inventive concept. Referring to FIGS. 7A and 7B, the die 200_a may, as compared with the die 200 in FIG. 2, further include through silicon vias TSV formed through a semiconductor substrate for an electrical contact with the outside. The through silicon vias TSV penetrating through the semiconductor substrate may be surrounded by an insulating layer. The through silicon vias TSV may be apart from the test circuit 220 and the semiconductor device 230 and may be electrically connected to the test circuit 220 or the semiconductor device 230 via conductive pads (701 and 702). The through silicon vias TSV may be at edges of the die 200_a. Alternatively, the through silicon vias TSV may be in the central portion of the die 200_a.

Figure 8A:
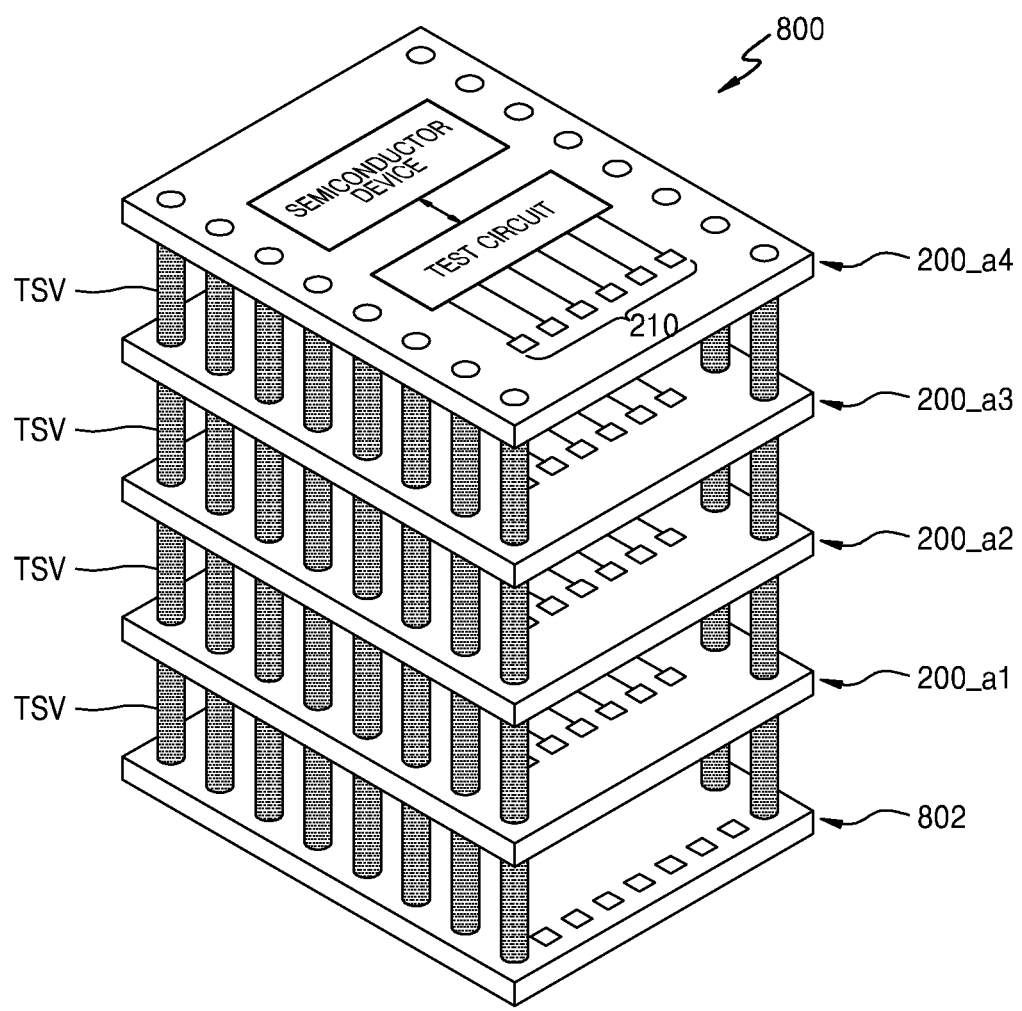
FIGS. 8A and 8B are diagrams of packages of a semiconductor device, according to embodiments of the inventive concept.
Figure 8B:
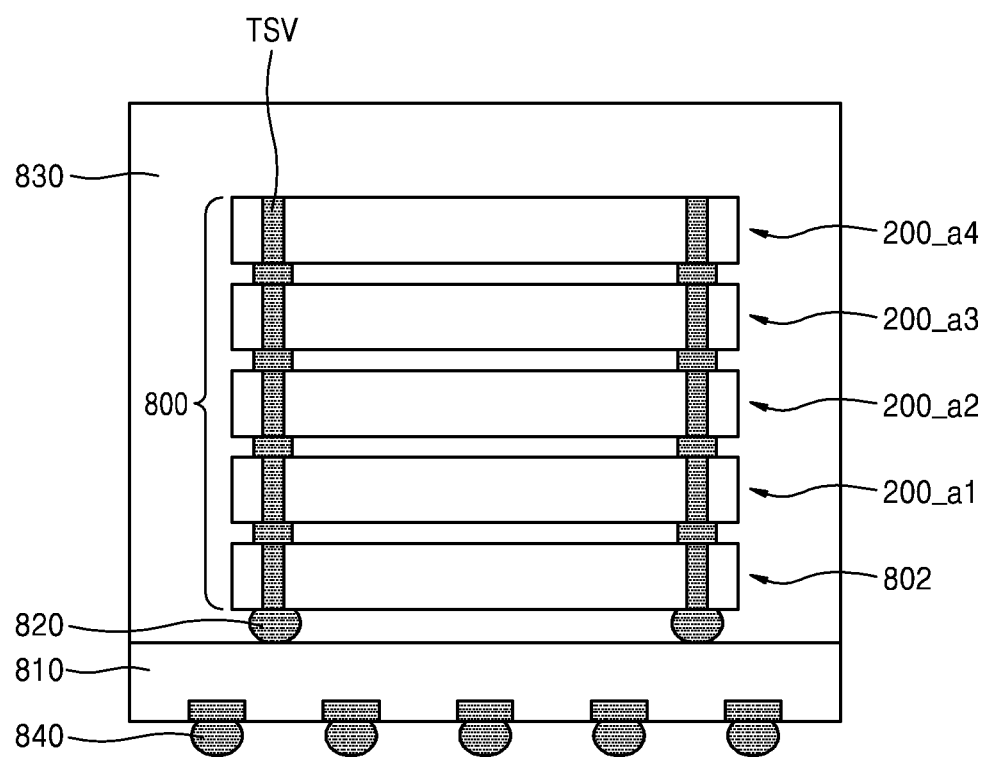

FIGS. 8A and 8B are diagrams of packages of the semiconductor device 230, according to embodiments of the inventive concept. In FIGS. 8A and 8B, examples are illustrated in which a stacked semiconductor chip 800, in which a plurality of dies 200_a of FIG. 7A are stacked, is mounted on a package substrate 810. According to the embodiment, the stacked semiconductor chip 800 may be packaged in a chip scale.

Referring to FIG. 8A, the stacked semiconductor chip 800 is illustrated in which each of a plurality of dies (200_a1, 200_a2, 200_a3, and 200_a4) including the test pads 210, the test circuit 220, and the semiconductor device 230 formed therein are connected to a buffer die 802. The through silicon vias TSV of the stacked semiconductor chip 800 may be in direct contact with each other, or may be electrically connected to each other by using a solder bump.

Referring to FIG. 8B, the stacked semiconductor chip 800 may be mounted on the package substrate 810. The stacked semiconductor chip 800 may be mounted by using a flip chip bonding method. The package substrate 810 may include various types of substrates such as a printed circuit board, a flexible substrate, and a tape substrate. The package substrate 810 may include a flexible printed circuit board, a rigid printed circuit board, or a combination thereof in which internal wirings are formed.

The package substrate 810 may have a top surface and a bottom surface and may include bonding pads, connection pads, and the internal wires. The bonding pads may be on the top surface of the package substrate 810 and may be electrically connected to the stacked semiconductor chip 800 via bumps 820. In other words, the bonding pads on the top surface of the package substrate 810 may be connected to the through silicon vias TSV of the dies (802, 200_a1, 200_a2, 200_a3, and 200_a4) by using the bumps 820. The connection pads may be on the bottom surface of the package substrate 810 and may be electrically connected to the bonding pads via the internal wirings. In addition, external connection terminals 840, for example, solder balls, which connect the semiconductor package to an external electronic device, may be attached to the connection pads. The stacked semiconductor chip 800 mounted above the package substrate 810 may be molded by a molding layer 830. The molding layer 830 may include, for example, an epoxy molding compound and may underfill between the package substrate 810 and the stacked semiconductor chip 80.

According to the embodiment, the stacked semiconductor chip 800 including the stacked dies (802, 200_a1, 200_a2, 200_a3, and 200_a4) may be packaged in a chip scale. In this case, the external connection terminals 840 for connection with the external electronic device may be attached to the buffer die 802, which is the lowermost die among the stacked dies (802, 200_a1, 200_a2, 200_a3, and 200_a4). The stacked semiconductor chip 800 may be configured as a high-bandwidth memory (HBM). The HBM may provide a wide I/O of a multi-channel interface type, for supporting various systems such as graphics, a server, a supercomputer, and a network, which require high performance and low power.

In the stacked semiconductor chip 800 of the HBM, the plurality of dies (200_a1, 200_a2, 200_a3, and 200_a4) in which the semiconductor device (230 in FIG. 3) of the DRAM is formed may be separated from the buffer die 802 and accordingly, are to be referred to as core dies. Each of the core dies (200_a1, 200_a2, 200_a3, and 200_a4) may constitute an independent interface called a channel. The typical HBMs of the four core dies (200_a1, 200_a2, 200_a3, and 200_a4) may be configured to include a total of eight I/O channels, two 128-bit channels per die, and a total of 1024-bit width. The buffer die 802 may provide an interface with eight I/O channels that independently operate. The buffer die 802 may operate, for example, as a master chip which independently provides a clock frequency, a command sequence, and data to each of eight I/O channels.

Figure 9:
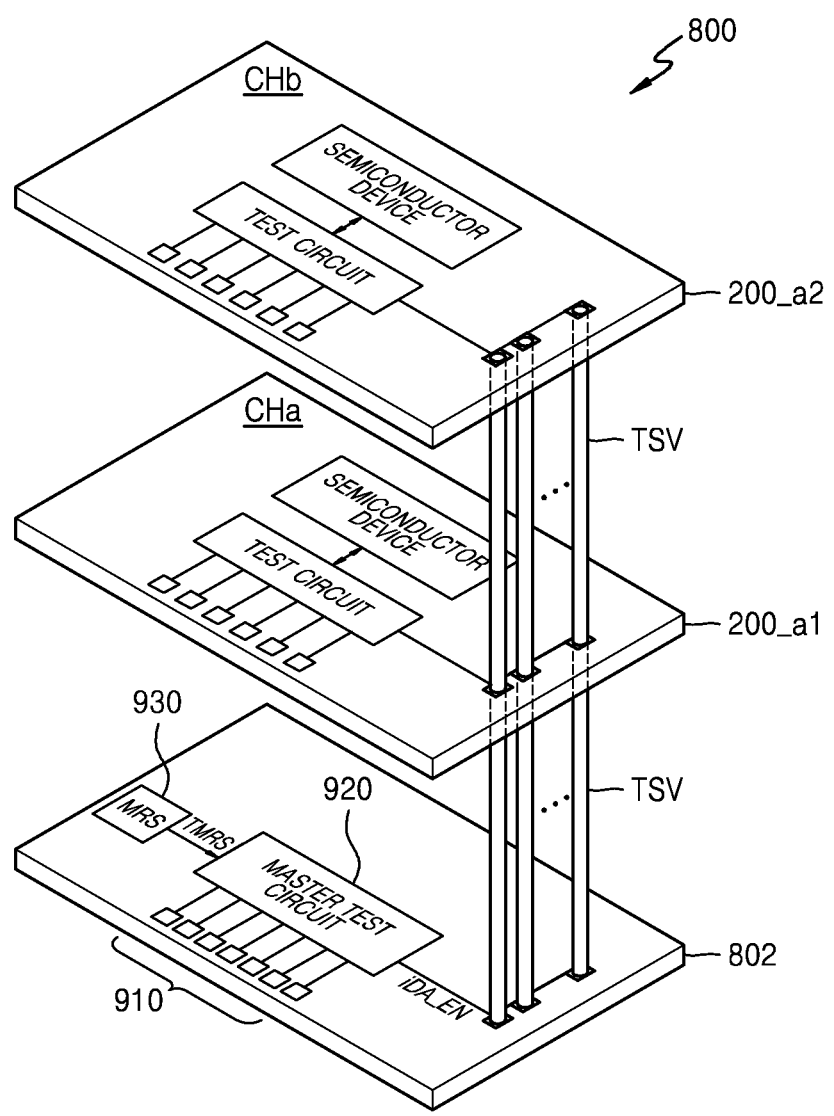
FIG. 9 is a block diagram of a buffer die for probe testing in a high-bandwidth memory (HBM) including a semiconductor device, according to an embodiment of the inventive concept.

There are several types of tests that are performed on the HBM. Below, examples of testing each of the I/O channels in the buffer die 802 to perform a probe test of the stacked semiconductor chip 800 are described in detail. For example, as shown by FIG. 9, a block diagram of a buffer die for probe testing in the HBM, including the semiconductor device 230, is illustrated, according to an embodiment of the inventive concept. In particular, FIG. 9 illustrates a first core die 200_a1 and a second core die 200_a2, and the buffer die 802 of the stacked semiconductor chip 800 of FIG. 8. Illustratively, the first core die 200_a1 may correspond to a first channel CHa, and the second core die 200_a2 may correspond to a second channel CHb.

Referring to FIG. 9, the buffer die 802 may include master test pads 910, a master test circuit 920, and a mode register 930. The master test pads 910 may be coupled to the tester (300 in FIG. 1) for the probe testing on the first channel CHa or the second channel CHb. In the probe test, the master test pads 910 may receive master test operation signals.

The master test circuit 920 may detect a toggling of any one of the test operation signals applied to the master test pads 910 and generate an internal master test enable signal iDA_EN based on the detected toggling. The internal master test enable signal iDA_EN may be provided to the first channel CHa or the second channel CHb via the through-silicon-vias (TSVs). In the embodiment, the tester 300 may be configured to test one channel, for example, the first channel CHa, via the master test pads 910. Accordingly, the internal master test enable signal iDA_EN may be provided to the first channel CHa.

The mode register 930 may be provided to program various operating options such as functions, characteristics, and modes of the HBM. The mode register 930 may be divided into various fields according to functions and/or modes and may be programmed by a mode register set (MRS) command or programmed with user defined variables. The mode register 930 may be configured to support the test mode. Contents of the mode register 930 may be set or updated after a power-up and/or a reset for a proper operation.

The mode register 930 may set or program a use/non-use of a pad (917 in FIG. 10) to which the test access signal DA_EN is applied among the master test pads 910 in the test mode. The mode register 930 may assign a test mode register set (TMRS) bit indicating the use/non-use of a DA_EN pad 917. Illustratively, when the TMRS bit is programmed with a value of "0", it may indicate that the DA_EN pad 917 is not used in the probe test. In this case, the master test circuit 920 may generate the internal master test enable signal iDA_EN to the logic high level. The internal master test enable signal iDA_EN of the logic high level may be provided to the first channel CHa via the through silicon via TSV. The first channel CHa may be configured to test the semiconductor device 230 based on the internal master test enable signal iDA_EN of the logic high level.

However, when the TMRS bit is programmed with a value of "1", it may indicate that the DA_EN pad 917 is used in the probe test. In this case, the master test circuit 920 may generate the internal master test enable signal iDA_EN to the logic low level. Although the internal master test enable signal iDA_EN also is provided to the first channel CHa via the through silicon via, the first channel CHa may be configured not to be affected by the internal master test enable signal iDA_EN of the logic low level. In this case, the first channel CHa may be directly or indirectly provided with the test access signal DA_EN applied via the DA_EN pad 917 and may be configured to test the semiconductor device 230 of the first channel CHa based on the test access signal DA_EN.

Figure 10:
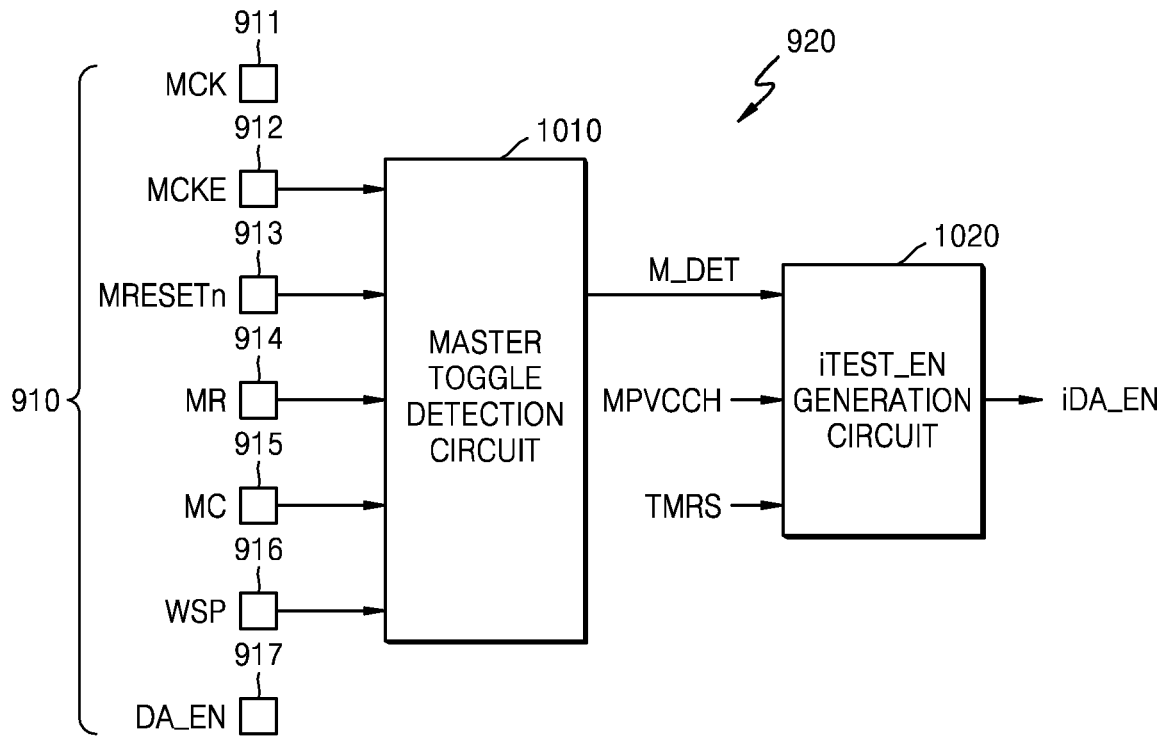
FIG. 10 is a block diagram of a master test circuit in a buffer die in FIG. 9, according to embodiments of the inventive concept.

FIG. 10 is a block diagram of the master test circuit 920 in the buffer die 802 in FIG. 9, according to embodiments of the inventive concept. Referring to FIG. 10, the master test circuit 920 may include a master toggle detection circuit 1010 and an iTEST_EN generation circuit 1020. The master test circuit 920 may receive signals related with a master test operation from the tester (300 in FIG. 1) via master test pads 910. The master test operation may be referred to as a probe test operation for selected channels of the stacked semiconductor chip 800 performed by the buffer die 802.

The tester 300 may be configured to apply a master clock signal MCK to a first master test pad 911, a master clock enable signal MCKE to a second master test pad 912, and a master reset signal MRESETn to a third master test pad 913. The master reset signal MRESETn may be configured to initialize the stack semiconductor chip 800 of the HBM to a full chip reset.

A row command and address signal MR may be applied to a fourth master test pad 914, and a column command and address signal MC may be applied to a fifth master test pad 915. The low command and address signal MR may include command code related with active, free charge, and refresh commands, a bank and a row address. The column command and address signal MC may include command code related with a write operation and a read operation, a mode register address, and code, a bank and a column address.

A core test instruction signal WSP may be applied to a sixth master test pad 916, and the test access signal DA_EN may be applied to a seventh master test pad 917. The core test instruction signal WSP and the test access signal DA_EN may be included in signals defined by the Institute of Electrical and Electronics Engineers (IEEE) standard 1500 protocol interface. The core test instruction signal WSP may include channel select code, a mask applied to a data word for the selected channel, a serial and/or parallel test access instruction, and a timing. The test access signal DA_EN may include a master test enable signal that directly enables a test of cores and related circuits embedded in the stacked semiconductor chip 800 of the HBM.

The master toggle detection circuit 1010 may be connected to the second through sixth master test pads 912 through 916 and may output a master toggle detection signal M_DET by detecting a toggling of any one of the signals applied to the second through sixth master test pads 912 through 916. The master toggle detection circuit 1010 may detect a toggling of any one of the master clock enable signal MCKE, the master reset signal MRESETn, the low command and address signal MR, the column command and address signal MC, and the core test instruction signal WSP and may output the master toggle detection signal M_DET as a detection result. Illustratively, the master toggle detection circuit 1010 may detect a toggling of the master reset signal MRESETn to the logic high level and trigger the master toggle detection signal M_DET to the logic high level. The master toggle detection signal M_DET may be provided to the iTEST_EN generation circuit 1020.

According to the embodiment, the master toggle detection circuit 1010 may detect a certain number or n (wherein n is a natural number) togglings in any one of the signals applied to the second through sixth master test pads 912 through 916 and output the master toggle detection signal M_DET. Illustratively, the master toggle detection circuit 1010 may detect a certain number or n togglings of the core test instruction signal WSP during a period where the master reset signal MRESETn is at the logic low level and may output the master toggle detection signal M_DET. The master toggle detection signal M_DET may be triggered to the logic high level based on the number of togglings, such as four (4) togglings, of the core test instruction signal WSP during a period where the master reset signal MRESETn is at the logic low level.

The iTEST_EN generation circuit 1020 may be configured to generate an internal master test enable signal iDA_EN in response to the master toggle detection signal M_DET, a master power voltage stabilization signal MPVCCH, and the TMRS bit signal. The master power supply voltage stabilization signal MPVCCH may be provided to the buffer die 802 and may be configured to be triggered to the logic high level when the level of the power supply voltage driving the stacked semiconductor chip 800 is stably maintained constant. The TMRS bit signal may be provided by the mode register (930 in FIG. 9) and may be configured to indicate the use/non-use of the DA_EN pad 917 to which the test access signal DA_EN is applied during the probe test.

Figure 11:
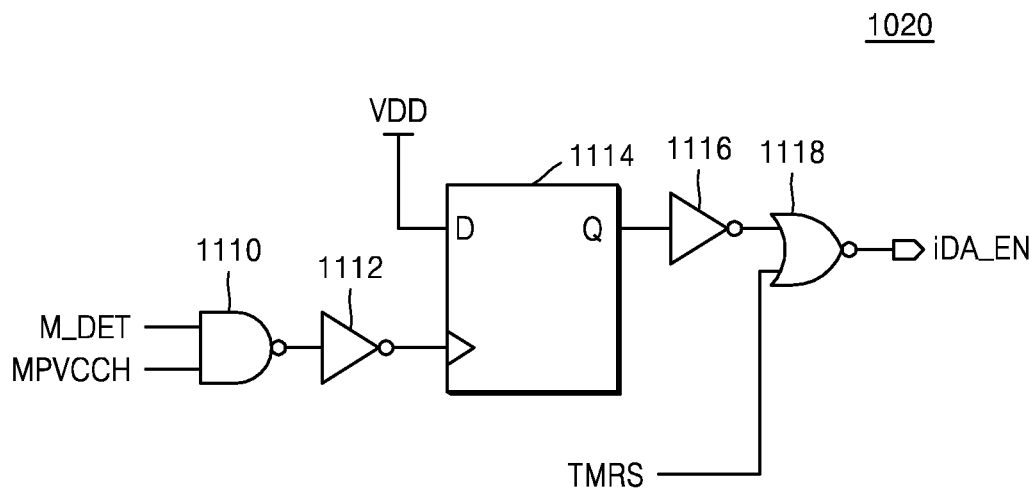
FIG. 11 is a detailed diagram of a configuration of an internal master test enable signal generation circuit in FIG. 10.

FIG. 11 is a detailed diagram of a configuration of the iTEST_EN generation circuit 1020 in FIG. 10. Referring to FIG. 11, the iTEST_EN generation circuit 1020 may include a NAND gate logic circuit 1110, a first inverter circuit 1112, a flip-flop circuit 1114, a second inverter circuit 1116, and a NOR gate logic circuit 1118. The NAND gate logic circuit 1110 may receive the master toggle detection signal M_DET and the master power supply voltage stabilization signal MPVCCH and may provide the NAND-operation output signal to the first inverter circuit 1112. The first inverter circuit 1112 may receive the output signal of the NAND gate logic circuit 1110 and provide the inverted output signal to the flip-flop circuit 1114.

The flip-flop circuit 1114 may include a data input terminal D connected to the power supply voltage VDD node and a clock signal input terminal connected to an output signal of the first inverter circuit 1112 and may provide the flip-flop-operation output signal to the second inverter circuit 1116. The second inverter circuit 1116 may receive the output signal of the flip-flop circuit 1114 and may provide the inverted output signal to the NOR gate logic circuit 1118.

The NOR gate logic circuit 1118 may receive the output signal of the second inverter circuit 1116 and the TMRS bit signal and may output the internal master test enable signal iDA_EN as the NOR-operation output signal. When the TMRS bit signal indicating the use of the DA_EN pad (917 in FIG. 9) is provided at the logic high level, the NOR gate logic circuit 1118 may output the internal master test enable signal iDA_EN at the logic low level such that the internal master test enable signal iDA_EN is inactivated. In this case, the test access signal DA_EN applied via the DA_EN pad 917 may be directly or indirectly provided to the first channel CHa via the through silicon vias TSV, and the first channel CHa may be configured to test the semiconductor device 230 based on the test access signal DA_EN. An operation in the case when the TMRS bit signal indicating the non-use of the DA_EN pad (917 in FIG. 9) is provided at the logic low level is described with reference to FIGS. 12A and 12B.

Figure 12A:
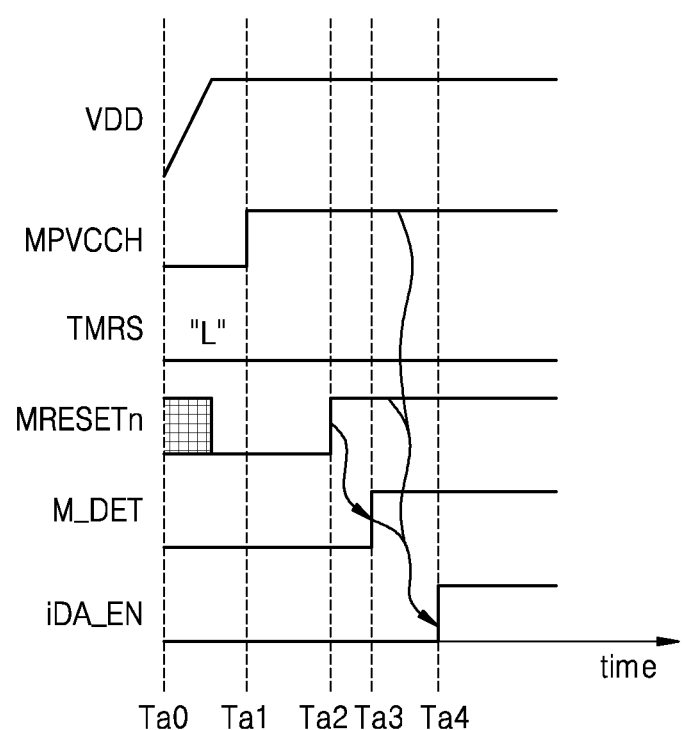
FIGS. 12A and 12B are timing diagrams illustrating an operation of the master test circuit of FIG. 10.
Figure 12B:
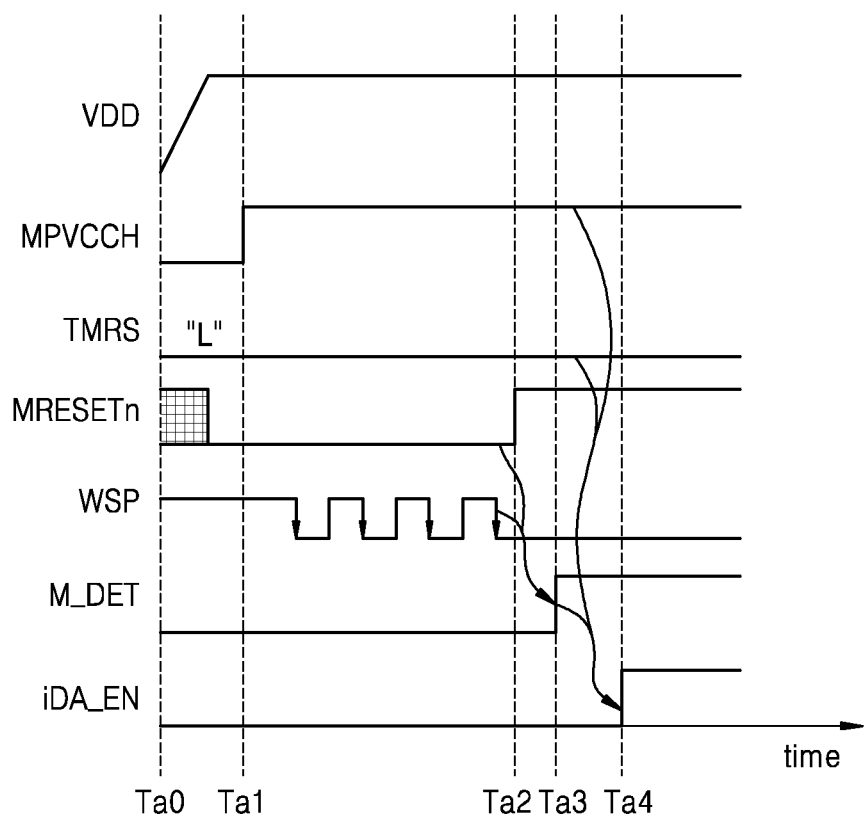

FIGS. 12A and 12B are timing diagrams illustrating the operation of the master test circuit 920 of FIG. 10. FIG. 12A illustrates an operation in which the internal master test enable signal iDA_EN is output based on a toggling of the master reset signal MTRESETn to the logic high level. FIG. 12B illustrates an operation in which the internal master test enable signal iDA_EN is output based on four togglings of the core test instruction signal WSP in an interval in which the master reset signal MTRESETn is at the logic low level.

Referring to FIG. 12A in conjunction with FIGS. 8A, 9, 10, and 11, at a time point Ta0, the power supply voltage VDD and test operation signals may be applied to the buffer die 802 of the stacked semiconductor chip 800 via the probe card from the tester (300 in FIG. 1). In the mode register 930, the TMRS bit indicating the non-use of the DA_EN pad 917 may be preserved, and the TMRS bit signal may be provided at the logic low level. When the power supply voltage VDD of the stacked semiconductor chip 800 is ramped up, the stacked semiconductor chip 800 may be initialized to the full chip reset in response to a transition of the master reset signal MRESETn to the logic low level.

At a time point Ta1, when the level of the power supply voltage VDD for driving the stacked semiconductor chip 800 is stably maintained constant, the buffer die 802 may trigger the master power supply voltage stabilization signal PVCCH to the logic high level. While the master power supply voltage stabilization signal MPVCCH is at the logic low level between the time point Ta0 and the time point Ta1, the iDA_EN generation circuit 1020 may deactivate the internal master test enable signal iDA_EN to the logic low level, which is a default value.

At a time point Ta2, the master toggle detection circuit 1010 may detect a toggling of the master reset signal MRESETn among the test operation signals of the master test pads 910. According to the embodiment, the master toggle detection circuit 1010 may detect a toggling of any one of the master clock enable signal MCKE, the row command and address signal MR, the column command and address signal MC, and the core test instruction signal WSP, in place of the master reset signal MRESETn.

At a time point Ta3, the master toggle detection circuit 1010 may trigger the master toggle detection signal M_DET to the logic high level as a result of detecting the toggling of the master reset signal MRESETn. And, at time point Ta4, the iDA_EN generation circuit 1020 may, in response to the master power supply voltage stabilization signal MPVCCH and the master toggle detection signal M_DET of the logic high level, output the output signal of the NAND gate logic circuit 1110 at the logic low level, output the output signal of the first inverter circuit 1112 and the output signal of the flip-flop circuit 1114 at the logic high level, and output the output signal of the second inverter circuit 1116 at the logic low level. The NOR gate logic circuit 1118 may output the internal master test enable signal iDA_EN of the logic high level, as the output signal thereof, in response to the TMRS bit signal of the logic low level and the output signal of the second inverter circuit 1116 of the logic low level.

The buffer die 802 that has performed the above operation may provide the internal master test enable signal iDA_EN of the logic high level to the first channel CHa via the through silicon vias TSV. The first channel CHa may be configured to test the semiconductor device 230 based on the internal master test enable signal iDA_EN of the logic high level.

Referring to FIG. 12B, compared with FIG. 12A, between the time point Ta1 and the time point Ta2, the master toggle detection circuit 1010 may detect, among the test operation signals of the master test pads 910, a toggling of any one of the remaining test operation signals during an interval in which the master reset signal MRESETn is at the logic low level. The master toggle detection circuit 1010 may detect a certain number of togglings of the core test instruction signal WSP during an interval in which the master reset signal MRESETn is at the logic low level.

Although the present embodiment illustrates an example of detecting the certain number of togglings, such as 4 togglings, of the core test instruction signal WSP set to the logic low level, the number of togglings may be variously set to n (wherein n is a natural number). According to the embodiment, the master toggle detection circuit 1010 may detect, in the interval in which the master reset signal MRESETn is at the logic low level, the certain n togglings of the master clock enable signal MCKE, the row command and signal MR, or the column command and address signal MC, in place of the core test instruction signal WSP.

At the time point Ta3, the master toggle detection circuit 1010 may trigger the master toggle detection signal M_DET to the logic high level, based on the 4 togglings of the core test instruction signal WSP of the logic low level in the interval in which the master reset signal MRESETn is at the logic low level. And, at time point Ta4, the iDA_EN generation circuit 1020 may output the internal master test enable signal iDA_EN as the output signal thereof, in response to the master power supply voltage stabilization signal MPVCCH and the master toggle detection signal M_DET of the logic high level and the TMRS bit signal of the logic low level. The internal master test enable signal iDA_EN of the logic high level may be supplied to the first channel CHa via the through silicon vias TSV, and the first channel CHa may be configured to test the semiconductor device 230 based on the internal master test enable signal iDA_EN of the logic high level.

Figure 13:
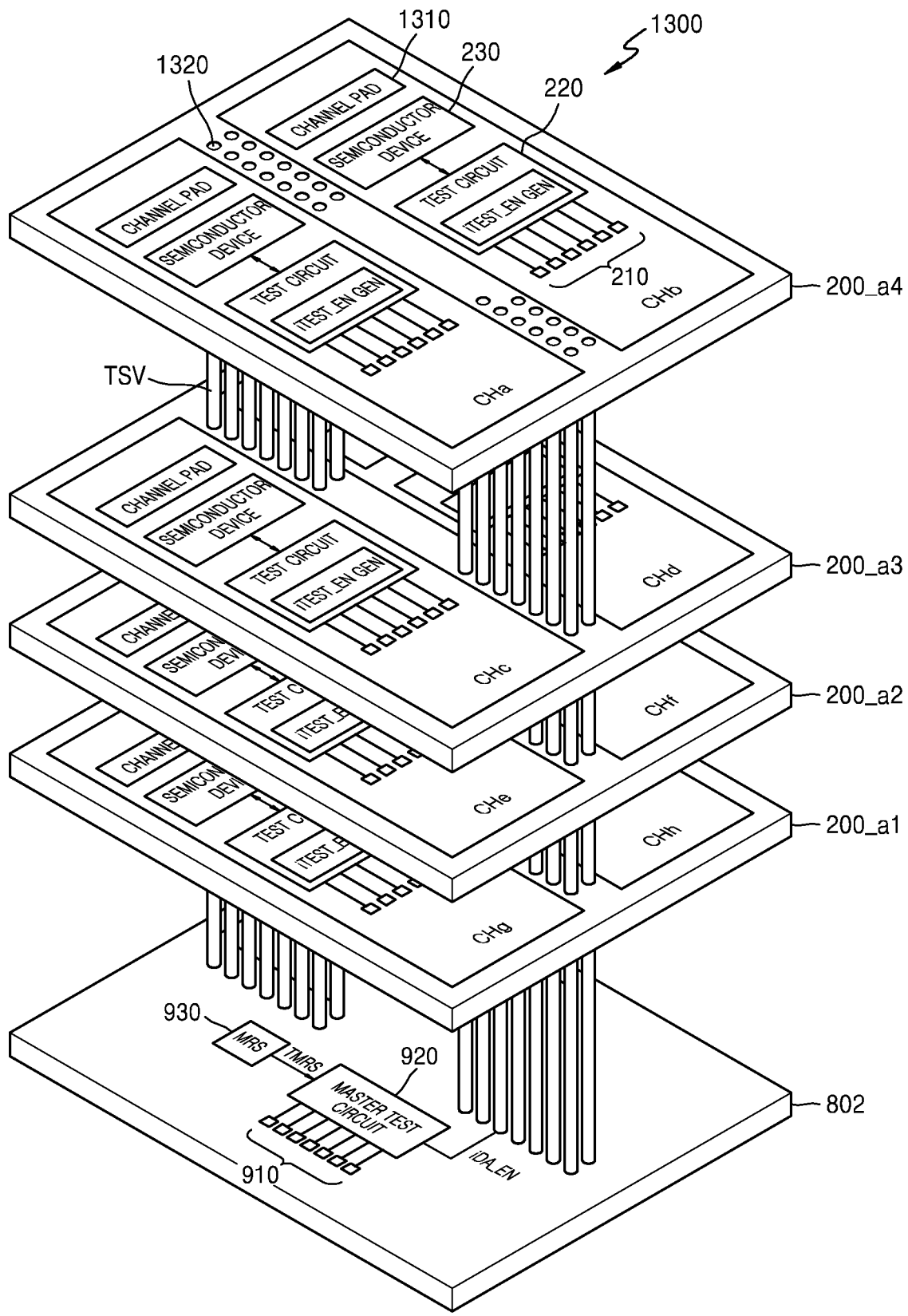
FIG. 13 is a diagram of the HBM implemented as a stacked semiconductor chip according to embodiments of the inventive concept.

FIG. 13 is a diagram of the HBM implemented as a stacked semiconductor chip according to embodiments of the inventive concept. Referring to FIG. 13, the HBM 1300 may include the plurality of core dies (200_a1, 200_a2, 200_a3, and 200_a4) and a buffer die 802, and the through silicon vias TSV may be at the center portions of the plurality of core dies (200_a1, 200_a2, 200_a3, and 200_a4). Each of the plurality of core dies (200_a1, 200_a2, 200_a3, and 200_a4) may include two channels (Cha-CHb, CHc-CHd, CHe-CHf, and CHg-CHh), respectively, and thus the HBM 1300 may have eight channels (Cha through CHh). Each of the channels (Cha through CHh) may include a channel pad 1310 connected to an electrode 1320 and the through silicon vias TSV via wires for a signal routing. A single channel may include two pseudo channels. When 128 DQ pads are included in the channel pad 1310, the 128 DQ pads may be divided into two groups of pseudo channels, and the number of DQ pads of each pseudo channel may be 64.

Each of the channels (Cha through CHh) may include the semiconductor device 230 that independently operates, the test pads 210 that receive test operation signals provided for the probe test by the tester (300 in FIG. 1), and the test circuit 220 for testing the semiconductor device 230.

The test circuit 220 may output the toggle detection signal by detecting a toggling of any one of the first test operation signals, or by detecting a certain number of, or n togglings of the second test operation signal in an interval in which a first test operation signal among the test operation signals is set to a certain logic level. The test circuit 220 may be configured to generate the internal test enable signal iTEST_EN in response to the toggle detection signal, and test the semiconductor device 230 based on the internal test enable signal iTEST_EN.

The buffer die 802 may provide an independent interface to each of the channels (Cha through CHh) via the through silicon vias TSV of the core dies (200_a1, 200_a2, 200_a3, and 200_a4). The buffer die 802 may include the master test pads 910 that receive master test operation signals provided for the probe test by the tester 300, the mode register 930 that sets the bit signal TMRS allocated to indicate the non-use of the test access signal DA_EN among the master test pads 910, and the master test circuit 920 that generates the internal master test enable signal iDA_EN.

The master test circuit 920 may output the master toggle detection signal by detecting a toggling of any one of the master test operation signals, or by detecting a certain number of togglings of a second master test operation signal in an interval in which a first master test operation signal among the master test operation signals is set to a certain logic level. The master test circuit 920 may generate the internal master test enable signal iDA_EN in response to the bit signal of the mode register set 930 and the master toggle detection signal M_DET, and transmit the internal master test enable signal iDA_EN to the internal test enable signal iTEST_EN line of a channel selected among the core dies (200_a1, 200_a2, 200_a3, and 200_a4) via the through silicon vias TSV.

Figure 14:
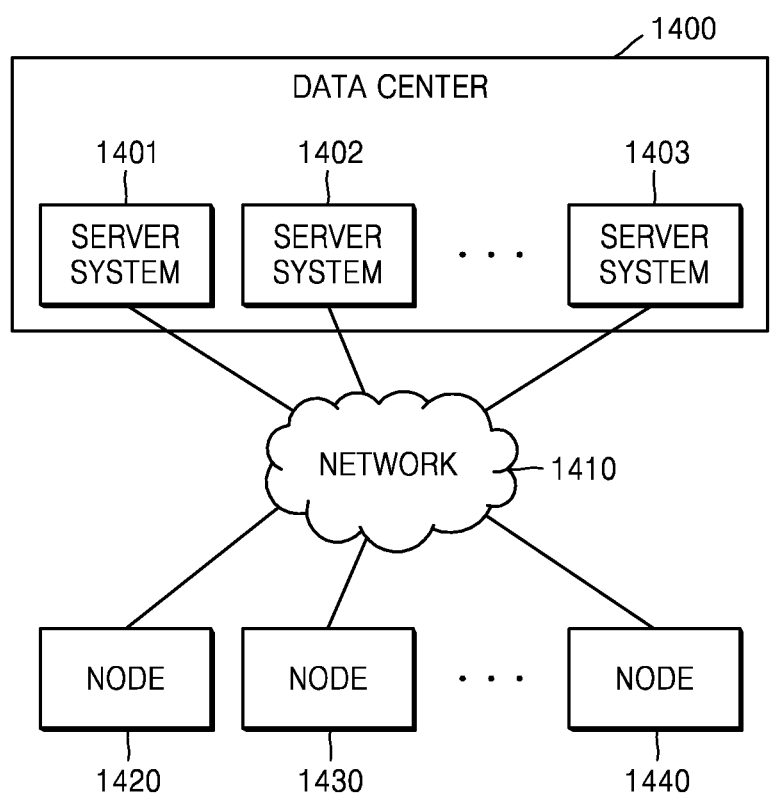
FIG. 14 is a block diagram of an application example in which the HBM implemented as a stacked semiconductor chip is applied to a data center, according to embodiments of the inventive concept.

FIG. 14 is a block diagram of an application example in which the HBM implemented as a stacked semiconductor chip is applied to a data center 1400, according to embodiments of the inventive concept. Referring to FIG. 14, the data center 1400 may integrate a plurality of computing resources distributed in a network 1410, and provide services required by users. The data center 1400 may include a plurality of server systems (1401, 1402, and 1403). Each of the plurality of server systems (1401, 1402, and 1403) may communicate with various nodes (1420, 1430, and 1440) through the network 1410 such as the Internet. Although the network 1410 is illustrated as a separate single network, the network may be any type of network that is generally understood by those of ordinary skill in the art. The network 1410 may be personal or public, wired or wireless, or a full or partial network. The nodes (1420, 1430, and 1440) may be any one of client computers, other servers, remote data centers, or storage systems.

The plurality of server systems (1401, 1402, and 1403) and/or the nodes (1420, 1430, and 1440) may include the HBM implemented as the stack semiconductor chip of the inventive concept. A stacked semiconductor chip may be implemented by using the embodiments illustrated in FIGS. 1 through 13. The stack semiconductor chip may include a plurality of core dies including a semiconductor device, each of which independently operates, and a buffer die that provides an independent channel interface to each of the plurality of core dies via through-electrodes of the plurality of core dies.

Each of the core dies may output a toggle detection signal by detecting a toggling of any one of test operation signals applied from an external tester, or by detecting a certain number ("n") of togglings of a second test operation signal in an interval in which a first test operation signal among the test operation signals is at a certain logic level, may generate an internal test enable signal in response to the toggle detection signal, and may perform a probe test on the semiconductor device 230 based on the internal test enable signal.

The buffer die may output a master toggle detection signal by detecting a toggling of any one of master test operation signals applied from the external tester, or by detecting n togglings of a second master test operation signal in an interval in which a first master test operation signal among the master test operation signals is at a certain logic level, generate an internal master test enable signal in response to a bit signal of a mode register allocated to indicate a non-use of a test access signal pad among master test pads by the external tester, transmit the internal master test enable signal to an internal test enable signal line of a channel selected among the core dies via through-electrodes, and perform the probe test on a semiconductor device of a channel selected based on the internal mater test enable signal.

While the inventive concept has been particularly shown and described with reference to embodiments thereof, it will be understood that various changes in form and details may be made therein without departing from the spirit and scope of the following claims.

What is claimed is:

1. A wafer-level method of testing an integrated circuit (IC) device, comprising:
applying a plurality of test operation signals to a wafer containing the IC device;
generating a test enable signal in response to detecting, on the wafer, a toggling of at least one of the plurality of test operation signals; and then testing at least a portion of the IC device in response to said generating the test enable signal.

2. The method of claim 1, wherein the wafer comprises a plurality of IC dies therein, which are separated from each other by a plurality of scribe lines; and wherein a first of the plurality of IC dies comprises the IC device.

3. The method of claim 1, wherein said generating comprises generating a test enable signal in response to detecting, on the wafer, an inactive-to-active transition of a toggle detection signal.

4. The method of claim 1, wherein said generating comprises generating a test enable signal in response to detecting, on the wafer, an: (i) inactive-to-active transition of a toggle detection signal, and (ii) an active level of a power supply stabilization signal during the inactive-to-active transition of the toggle detection signal.

5. The method of claim 1, wherein said generating comprises generating a test detection signal in response detecting, on the wafer, a toggling of a first one of the plurality of test operation signals multiple times.

6. The method of claim 1, wherein said generating comprises generating a test detection signal in response detecting, on the wafer, a: (i) toggling of a first one of the plurality of test operation signals multiple times, and (ii) an inactive level of a reset signal during the toggling of the first one of the plurality of test operation signals multiple times.

7. The method of claim 2, wherein said testing is following by singulating the wafer along a plurality of scribe lines to thereby separate the plurality of IC dies from each other.

8. An integrated circuit wafer, comprising:
a plurality of integrated circuit (IC) dies separated from each other by a plurality scribe lines on the wafer, said plurality of IC dies including a first IC die having a plurality of test pads thereon and a plurality of integrated circuits therein, including a test circuit configured to generate a test enable signal in response to detecting a toggling of at least one of a plurality of test operation signals applied to the plurality of test pads by an external tester electrically coupled by a plurality of probes to the plurality of test pads.

9. The wafer of claim 8, wherein the test circuit is configured to generate the test enable signal in response to detecting an inactive-to-active transition of a toggle detection signal within the test circuit.

10. The wafer of claim 9, wherein the test circuit is configured to generate the inactive-to-active transition of the toggle detection signal in response to detecting a toggling of a first one of the plurality of test operation signals multiple times.

11. A wafer level test method of a semiconductor device comprised in a die formed on a top surface of a wafer, the wafer level test method comprising:
receiving, on the die, test operation signals provided by an external tester via test pads of the die;
detecting, on the die, a toggling of any one of the test operation signals;
generating, on the die, an internal test enable signal in response to the detected toggling; and
performing, on the die, a test on the semiconductor device based on the internal test enable signal.

12. The wafer level test method of claim 11, wherein the detecting of the toggling of any one of the test operation signals comprises:
detecting a toggling of a first test operation signal among the test operation signals to a certain logic level, and
the first test operation signal is a reset signal for initializing the semiconductor device.

13. The wafer level test method of claim 12, wherein the toggling of the first test operation signal is detected after a level of a power supply voltage driving the semiconductor device is stably maintained constant.

14. The wafer level test method of claim 11, wherein the detecting of the toggling of any one of the test operation signals comprises:
detecting a toggling of a second test operation signal among the test operation signals in an interval in which a first test operation signal is at a certain logic level, the first test operation signal is a reset signal for initializing the semiconductor device, and the second test operation signal is any one of the other signals except for the first test operation signal among the test operation signals.

15. The wafer level test method of claim 14, wherein the second test operation signal is any one of a clock enable signal, a row access strobe signal, a column access strobe signal, and a write enable signal which control an operation of the semiconductor device.

16. The wafer level test method of claim 14, wherein the toggling of the second test operation signal is detected after the second test operation signal is toggled to a certain logic level for n (wherein n is a natural number) times.

17. The wafer level test method of claim 14, wherein the toggling of the second test operation signal is detected after the level of a power supply voltage driving the semiconductor device is stably maintained constant.

18. A wafer level test method of a stacked semiconductor chip in which a plurality of core dies comprising semiconductor devices each configured to independently operate and a buffer die configured to provide a channel interface independent of each of the core dies are stacked, the wafer level test method comprising:
setting, on the buffer die, a mode register set (TMRS) bit signal allocated to indicate that a test access signal pad is not used by an external tester;
receiving, on the buffer die, master test operation signals provided by the external tester via master test pads of the buffer die;
detecting, on the buffer die, a toggling of any one of the master test operation signals;
generating, on the buffer die, an internal master test enable signal in response to the detected toggling after receiving the TMRS bit signal;
transmitting, on the buffer die, the internal master test enable signal via through-electrodes of the core dies to an internal test enable signal line of a channel selected from the core dies; and
performing a test on the semiconductor device, in the selected channel, based on the internal master test enable signal.

19. The wafer level test method of claim 18, wherein the detecting of the toggling of any one of the master test operation signals comprises:
detecting a toggling of a first master test operation signal among the master test operation signals to a certain logic level, and
the first master test operation signal is a master reset signal for initializing the stacked semiconductor chip.

20. The wafer level test method of claim 19, wherein the toggling of the first master test operation signal is detected after a level of a power supply voltage driving the stacked semiconductor chip is stably maintained constant.

* * * * *